(12) United States Patent
Tsukio

(10) Patent No.: US 11,982,247 B2
(45) Date of Patent: May 14, 2024

(54) LOAD DRIVE DEVICE

(71) Applicant: HITACHI ASTEMO, LTD., Hitachinaka (JP)

(72) Inventor: Koichi Tsukio, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/772,968

(22) PCT Filed: Oct. 20, 2020

(86) PCT No.: PCT/JP2020/039323
§ 371 (c)(1),
(2) Date: Apr. 28, 2022

(87) PCT Pub. No.: WO2021/085226
PCT Pub. Date: May 6, 2021

(65) Prior Publication Data
US 2022/0412281 A1 Dec. 29, 2022

(30) Foreign Application Priority Data

Oct. 28, 2019 (JP) ................................ 2019-195626

(51) Int. Cl.
*F02D 41/20* (2006.01)
*H03K 17/12* (2006.01)

(52) U.S. Cl.
CPC ........... *F02D 41/20* (2013.01); *H03K 17/122* (2013.01); *F02D 2041/2093* (2013.01)

(58) Field of Classification Search
CPC .......... F02D 41/20; F02D 41/22; F02D 45/00; F02D 2041/2093; H03K 17/00;
(Continued)

(56) References Cited

U.S. PATENT DOCUMENTS 8,161,946 B2 * 4/2012 Pursifull ............. F02D 41/3094
  701/114
8,427,222 B2 * 4/2013 Saeki ................... G09G 3/3283
  327/108
(Continued)

FOREIGN PATENT DOCUMENTS

JP 06-65864 A 8/1994
JP 10-252539 A 9/1998
(Continued)

OTHER PUBLICATIONS

JP2016201661 English Translation Version (Year: 2016).*
(Continued)

*Primary Examiner* — John Kwon
*Assistant Examiner* — Johnny H Hoang
(74) *Attorney, Agent, or Firm* — Foley & Lardner LLP

(57) ABSTRACT

A large current flowing when energization by normal load drive control is performed at the time of a load short-circuit is prevented. A load drive device 100 includes drive switches 61 and 62 that turn on or off the current supplied from a power source to a load 70, a switch drive circuit 20 that transmits a drive signal to the drive switches 61 and 62 based on a control command from an arithmetic device 10, and a constant current source 40 that supplies the current to the load 70 without passing through the drive switches 61 and 62. Then, the switch drive circuit 20 performs control so as not to turn on either the drive switches 61 or 62 when the voltage between both ends of the load 70 becomes equal to or less than the determination value in a state where the drive switches 61 and 62 are turned off and in a state where the current is supplied from the constant current source 40 to the load 70.

22 Claims, 9 Drawing Sheets

(58) Field of Classification Search
CPC .... H03K 17/08; H03K 17/695; H03K 17/122; H02M 1/08
See application file for complete search history.

(56) References Cited

U.S. PATENT DOCUMENTS

| | | | | |
|---|---|---|---|---|
| 8,649,151 | B2* | 2/2014 | Yamada | F02D 41/20 |
| | | | | 361/152 |
| 8,978,625 | B2* | 3/2015 | Okuda | F02D 41/20 |
| | | | | 123/490 |
| 2004/0118384 | A1 | 6/2004 | Oyama et al. | |
| 2018/0006496 | A1* | 1/2018 | Liu | H02J 50/12 |

FOREIGN PATENT DOCUMENTS

| | | |
|---|---|---|
| JP | 2003-056386 A | 2/2003 |
| JP | 2004-124890 A | 2/2004 |
| JP | 2007-96754 A | 4/2007 |
| JP | 2015-10555 A | 1/2015 |
| JP | 2016-201661 A | 12/2016 |

OTHER PUBLICATIONS

International Search Report with English translation and Written Opinion issued in corresponding application No. PCT/JP2020/039323 dated Jan. 6, 2021.

* cited by examiner

LOAD DRIVE DEVICE

CROSS-REFERENCE TO RELATED APPLICATIONS

This application is a National Stage Entry to the U.S. for International Patent Application No. PCT/JP2020/039323, filed Oct. 20, 2020, which claims priority to Japanese Patent Application No. 2019-195626, filed Oct. 28, 2019, the full disclosures of each are incorporated herein for reference in their entireties.

TECHNICAL FIELD

The present invention relates to a load drive device that drives a load, and particularly relates to a technique for protecting a circuit of the load drive device.

BACKGROUND ART

As a circuit protection mechanism of a load drive device, for example, in an abnormality detection device of a fuel injection valve according to PTL 1, a technology is known in which a constant current source is provided on a downstream side of the fuel injection valve, and an abnormality of the fuel injection valve is detected based on a potential difference generated at a predetermined portion of the circuit when a current to an extent that fuel injection does not occur is supplied.

In addition, in a failure diagnosis method of a fuel injection device and the device according to PTL 2, there is known a technique of detecting a failure of the fuel injection device by generating a constant current at which the fuel injection valve does not operate and detecting a current value when the fuel injection device is energized.

CITATION LIST

Patent Literature

PTL 1: JP 6-65864 A
PTL 2: JP 10-252539 A

SUMMARY OF INVENTION

Technical Problem

However, when a short-circuit failure occurs in the load (on the fuel injection valve side), performing normal control only by diagnosis leads to energization to a circuit having no current limited by the load and low resistance, so that an excessive current flows into the circuit, leading to circuit breakdown and circuit burnout in the worst case.

In addition, even in a case of performing a method of prohibiting the operation of the load drive device when it is determined that the load is short-circuited by the diagnosis based on the current value at the time of the load drive control according to the conventional technology, the load is in the load short-circuit state, and thus, the current is supplied to the load having a low resistance as compared with the load at the normal time. Therefore, a large current flows through the circuit of the load drive device even during a period from when the diagnosis is confirmed until the operation of the load drive device is prohibited.

For this reason, as a driver used in the load drive device, it is needed to select a driver, an absolute maximum rated driver that can withstand a large current flowing until the operation of the load drive device is prohibited by performing energization by normal control at the time of a load short-circuit and using a diagnosis is needed to be selected rather than an absolute maximum rated driver that can withstand a current value used for normal load driving.

In view of the above circumstances, there has been a demand for a method capable of preventing a large current flowing when energization is performed by normal load drive control at the time of a load short-circuit.

Solution to Problem

In order to solve the above problem, a load drive device according to one aspect of the present invention includes a drive switch that turns on or off a current supplied from a power source to a load, a switch drive circuit that transmits a drive signal to the drive switch based on a control command from an arithmetic device, and a constant current source that supplies a current to the load without passing through the drive switch. Then, the switch drive circuit performs control so as not to turn on the drive switch when a voltage between both ends of the load becomes equal to or less than a determination value in a state where the drive switch is turned off and in a state where a current is supplied from the constant current source to the load.

A load drive device according to another aspect of the present invention includes a drive switch that turns on or off a current supplied from a power source to a load, a switch drive circuit that transmits a drive signal to the drive switch based on a control command from an arithmetic device, and a constant current source that supplies a current to the load without passing through the drive switches, in which a plurality of different determination values are set as determination values. Then, in a state where the drive switch is turned off and in a state where a current is supplied from the constant current source to the load, the switch drive circuit determines a range in which a voltage between both ends of the load is included among ranges divided by the plurality of determination values, and notifies the arithmetic device of a determination result, and the arithmetic device performs control according to the determination result.

Advantageous Effects of Invention

According to at least one embodiment of the present invention, the short-circuit failure is diagnosed before the load drive control is performed at the time of the load short-circuit, and the operation of the load drive device is prohibited. Therefore, it is possible to prevent a large current from flowing when energization is performed by normal load drive control.

Objects, configurations, and effects besides the above description will be apparent through the explanation on the following embodiments.

DESCRIPTION OF EMBODIMENTS

Figure 1:
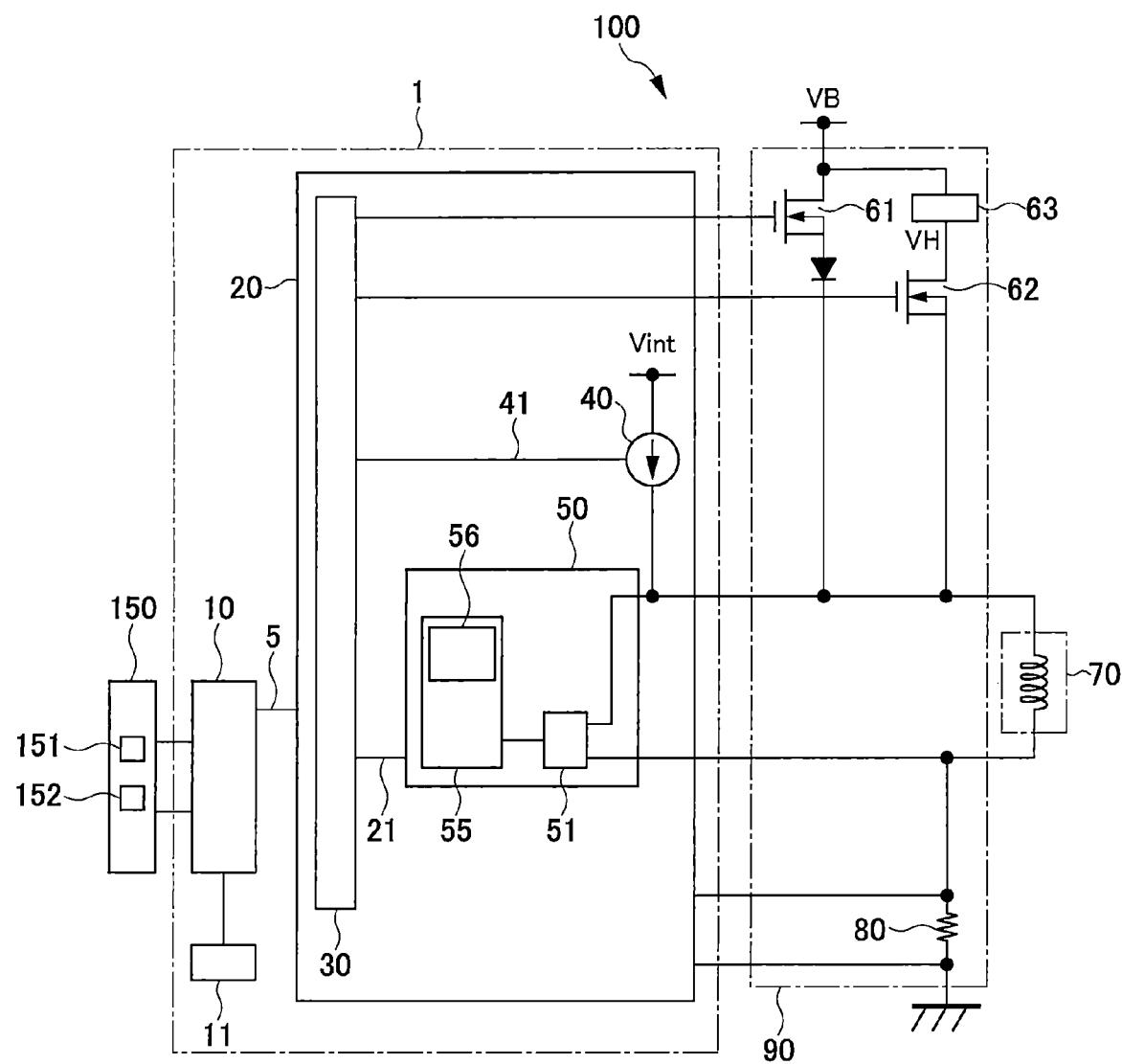
FIG. 1 is a circuit diagram illustrating a configuration example of a load drive device according to a first embodiment of the present invention.

Hereinafter, examples of modes for carrying out the present invention will be described with reference to the accompanying drawings. In the present specification and the accompanying drawings, components having substantially the same function or configuration are denoted by the same reference numerals, and redundant description is omitted.

First Embodiment

First, a configuration of a load drive device according to a first embodiment of the present invention will be described.

FIG. 1 is a circuit diagram illustrating a configuration example of a load drive device 100 according to the first embodiment. The load drive device 100 includes an electronic control device 1 and an injector circuit 90 that drives an injector 70 according to a control command of the electronic control device 1. The electronic control device 1 is, for example, an electronic control unit (ECU) that controls control target equipment mounted on an automobile. The injector 70 is a fuel injection device that directly injects fuel into a combustion chamber of an internal combustion engine, and is an example of a load. The injector circuit 90 may be built in the electronic control device 1.

The electronic control device 1 includes an arithmetic device 10, a memory 11, and a pre-driver circuit 20.

As the arithmetic device 10, for example, a processor such as a central processing unit (CPU) or a micro-processing unit (MPU) is used. The memory 11 is, for example, a semiconductor memory such as a ROM or a RAM. The arithmetic device 10 reads and executes a computer program stored in the memory 11 to realize the function of the electronic control device 1, that is, the load drive device 100.

The pre-driver circuit 20 (an example of a switch drive circuit) includes a controller 30, an internal constant current source 40, and a voltage monitoring circuit 50.

The controller 30 controls the entire operation of the pre-driver circuit 20 based on the control command output from the arithmetic device 10. For example, the controller 30 generates a drive signal to be transmitted to a valve opening driver 62 and a holding driver 61 included in the injector circuit 90 based on a control command of the arithmetic device 10. In addition, the controller 30 generates a command for controlling energization and non-energization of the internal constant current source 40 based on the drive signals to the valve opening driver 62 and the holding driver 61.

The internal constant current source 40 (an example of a constant current source) is connected to the upstream side of the injector 70 (load), that is, the source side of the valve opening driver 62 and the holding driver 61. The internal constant current source 40 generates a constant current to be supplied to the injector 70 from a voltage Vint obtained from an arbitrary power source according to a command of the controller 30. For example, a reference voltage VB supplied from a battery (not illustrated) may be used as the voltage Vint. In the present embodiment, the constant current generated by the internal constant current source 40 is supplied to the injector 70 without passing through the valve opening driver 62 and the holding driver 61. Note that the internal constant current source 40 may be outside the pre-driver circuit 20.

The voltage monitoring circuit 50 is connected to both ends of the injector 70 (excitation coil illustrated in FIG. 1), and takes in and monitors a voltage (voltage between both ends) applied to both ends of the injector 70. The voltage monitoring circuit 50 includes a differential voltage measuring device 51, a voltage comparison result calculation circuit 55, and a determination value table 56.

The differential voltage measuring device 51 measures a differential voltage (monitor voltage) corresponding to a voltage between both ends of the injector 70, and outputs a measurement result to the voltage comparison result calculation circuit 55.

The determination value table 56 stores, as a determination value, a voltage value determined in advance as a comparison criterion for failure diagnosis. In the present embodiment, a predetermined fixed value is stored in the determination value table 56, but since it is predicted that the resistance value varies depending on the load to be driven, a configuration in which the determination value in the determination value table 56 can be freely changed is also conceivable.

The voltage comparison result calculation circuit 55 compares the determination value stored in the determination value table 56 with the differential voltage measured by the differential voltage measuring device 51 and determines the comparison result. Then, the voltage comparison result calculation circuit 55 outputs the determination result to the controller 30, and the controller 30 controls driving of the injector 70 according to the determination result.

The injector circuit 90 includes the holding driver 61 (first drive switch) that turns on or off a current supplied to the injector 70 from a power source (reference voltage VB) such as a battery (not illustrated), and the valve opening driver 62 (second drive switch) that turns on or off a current supplied to the injector 70 from a booster circuit 63 that generates a high voltage (valve opening voltage VH) based on the voltage (reference voltage VB) of the power source. A switch element such as a metal-oxide semiconductor field-effect transistor (MOSFET) is used as the holding driver 61 and the valve opening driver 62.

These drive switches (the holding driver 61, the valve opening driver 62) are disposed on an upstream side of the load in the direction in which the current supplied from the power source (for example, the battery of the reference voltage VB) to the load (injector 70) flows. This makes it possible to switch between energization and non-energization of the load disposed on an upstream side of the load.

Further, an injector current monitoring resistor 80 is connected between the downstream side of the injector 70 and the ground terminal.

An operation display device 150 is connected to the arithmetic device 10 of the electronic control device 1 via an input/output interface (not illustrated). The operation display device 150 includes a display unit 151 and an operation unit 152. Information indicating the state of the load drive device 100 output from the arithmetic device 10 is displayed on the display unit 151. As the display unit 151, for example, a display lamp (warning lamp) or a liquid crystal panel is used. The operation unit 152 generates an input signal according to a user's operation and outputs the input signal to the arithmetic device 10. The arithmetic device 10 performs calculation and control according to the input signal. For example, the operation display device 150 may be a portable information processing device (PC: Personal Computer) such as a tablet terminal.

Note that the load drive device 100 is a high-side drive system that turns on or off the power source side of the load (injector 70), but may be a low-side drive system that turns on or off the ground side of the load (injector 70).

Figure 2:
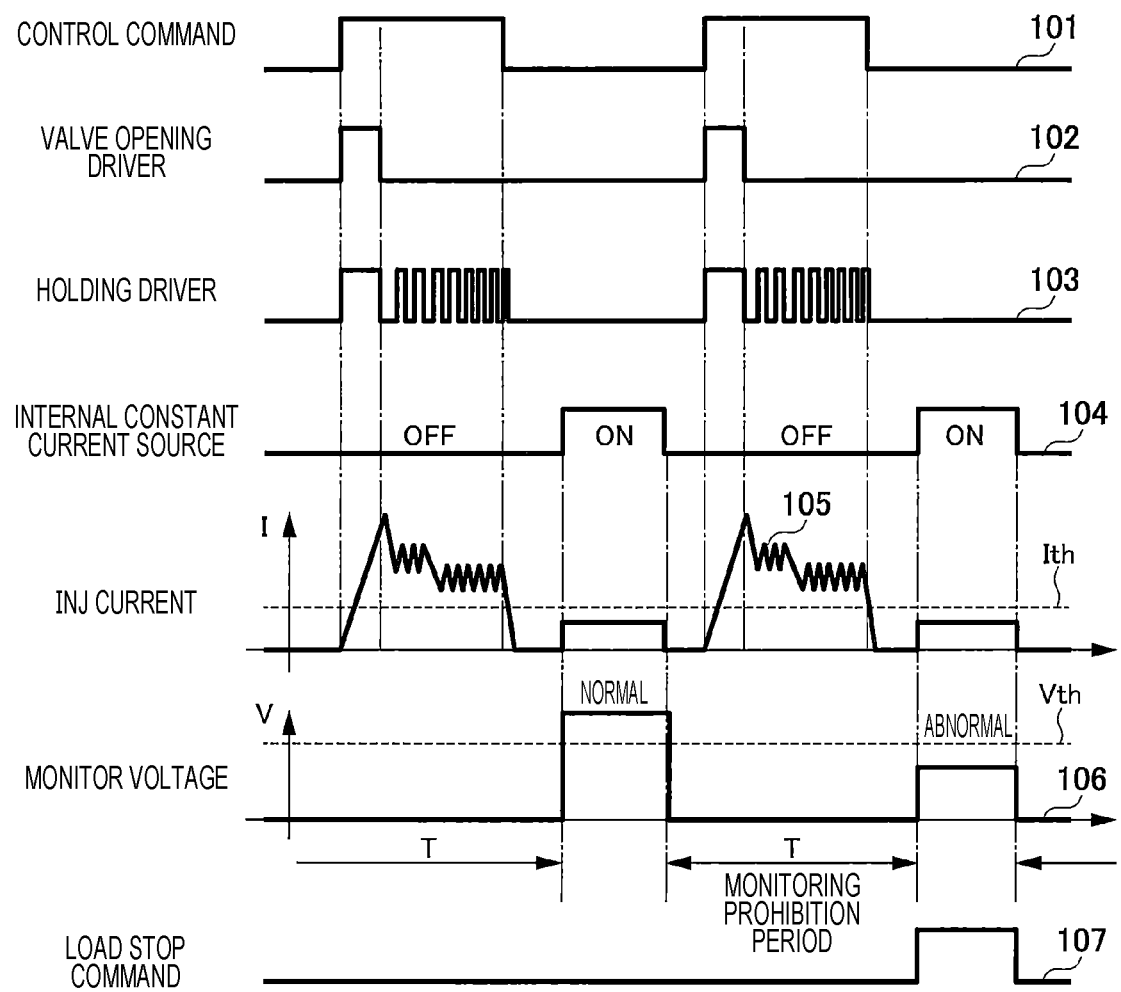
FIG. 2 is a timing chart illustrating an operation and a signal of each unit of the load drive device according to the first embodiment of the present invention.

FIG. 2 is a timing chart illustrating an operation and a signal of each unit of the load drive device 100.

In the load drive device 100, a control command signal (signal 101) is input from the arithmetic device 10 to the pre-driver circuit 20 via a pre-driver control command line 5. The pre-driver circuit 20 that has received the control command signal performs ON control (signals 102 and 103) on the valve opening driver 62 and the holding driver 61 from the controller 30 to energize the injector 70 (load).

The control command signal includes a valve opening current control signal and a holding current control signal. The valve opening current control signal is a signal for controlling a current applied to the excitation coil in order to open the injector 70. This corresponds to, for example, in an INJ current indicated by the waveform 105 in FIG. 2, from the rise of the INJ current to the constant current value through the peak. The holding current control signal is a signal for controlling a current applied to the excitation coil in order to hold the valve open state of the injector 70 for a certain period of time. This corresponds to a constant current value of a lower value after the peak of the INJ current, for example, in the INJ current shown in the waveform 105 of FIG. 2.

In the injector circuit 90, a current flowing to the injector 70 is monitored by the injector current monitoring resistor 80 connected to the downstream side of the injector 70. The pre-driver circuit 20 controls the current supplied to the injector 70 based on the current detected by the injector current monitoring resistor 80.

The controller 30 also controls the internal constant current source 40 and the voltage monitoring circuit 50 together with the valve opening driver 62 and the holding driver 61. When the controller 30 turns on the internal constant current source 40 through the internal constant current source control line (signal 104), the internal constant current source 40 energizes the injector 70. In the present embodiment, the internal constant current source 40 is turned on to energize the injector 70 at a timing when the controller 30 does not perform ON control on the valve opening driver 62 and the holding driver 61 (a period other than a monitoring prohibition period T). Then, while the injector 70 is energized from the internal constant current source 40, the voltage monitoring circuit 50 monitors the voltage between both ends of the injector 70 to perform failure diagnosis (also simply referred to as "diagnosis").

The internal constant current source 40 supplies a current to the injector 70 under the control of the controller 30. The current supplied from the internal constant current source 40 to the injector 70 is a current smaller than the current (current threshold Ith) flowing to the injector 70 when the injector 70 is driven, that is, a weak current to such an extent that the injector 70 does not open.

In the present embodiment, the injector 70 is assumed as a load, and the current output from the internal constant current source 40 is set to a weak current not to open the valve. However, various loads such as a motor, a relay, and a valve are assumed as a load to be actually driven. The weak current is a current to such an extent that these loads do not operate, and the current value of the weak current varies depending on the type and characteristics of the load to be driven.

When the internal constant current source 40 is in the energized state by the controller 30, the voltage monitoring circuit 50 monitors the voltage applied to both ends of the injector 70 by the differential voltage measuring device 51.

The monitored voltage (waveform 106) obtained by the differential voltage measuring device 51 is output to the voltage comparison result calculation circuit 55 and compared with the determination value stored in the determination value table 56. Here, since the current flowing to the injector 70 is constant by the internal constant current source 40, the voltage between both ends of the injector 70 is determined by the resistance value of the injector 70 according to Ohm's law. Therefore, for example, when a short-circuit failure (short) occurs in the injector 70, the resistance value of the injector 70 becomes a significantly smaller value than that before the failure, and the voltage between both ends of the injector 70 also becomes small in proportion to the resistance value of the injector 70 when the short-circuit occurs.

Therefore, the determination value (voltage threshold Vth) stored in the determination value table 56 is determined in advance based on the resistance value of the injector 70 at the normal time and the constant current value of the internal constant current source 40. When the measurement result (the voltage between both ends of the injector 70) obtained by the differential voltage measuring device 51 is equal to or less than the determination value (voltage threshold Vth) in the determination value table 56, the resistance value of the injector 70 is assumed to be small, that is, an abnormal state (for example, a short-circuit failure). Therefore, the voltage comparison result calculation circuit 55 outputs a load stop command (signal 107) to the controller 30 via the load stop command line 21. Conversely, when the measurement result obtained by the differential voltage measuring device 51 is larger than the determination value (voltage threshold Vth) in the determination value table 56, it is assumed that the resistance value of the injector 70 is large, that is, normal.

The controller 30 that has received the load stop command prohibits the output of the ON control to the valve opening driver 62 and the holding driver 61. In other words, the controller 30 performs OFF control on the valve opening driver 62 and the holding driver 61. As a result, the valve opening driver 62 and the holding driver 61 are controlled not to be turned on.

Voltage Amplifier Circuit

Figure 3:
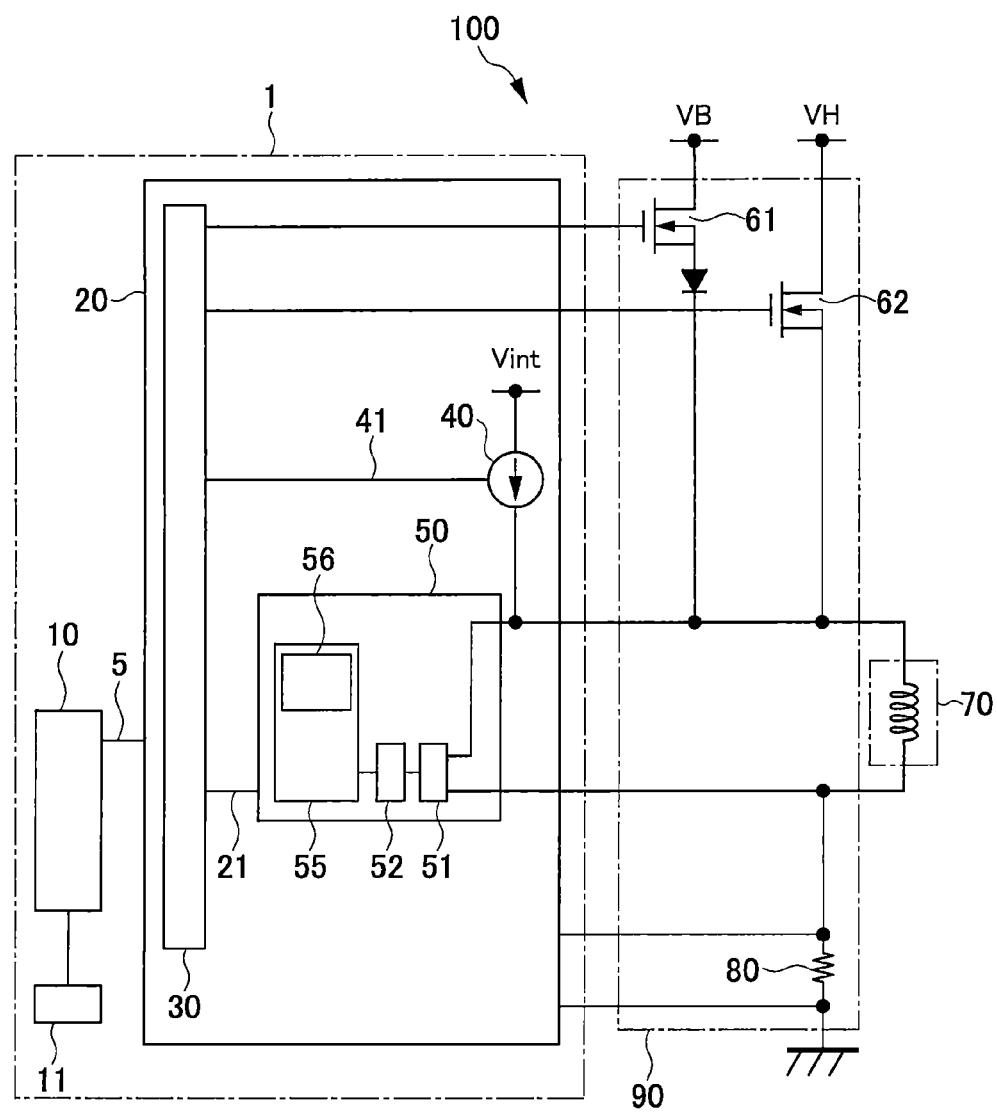
FIG. 3 is a circuit diagram illustrating another configuration example of the load drive device according to the first embodiment of the present invention.

In the present embodiment, it is assumed that the differential voltage obtained by the differential voltage measuring device 51 is directly output to the voltage comparison result calculation circuit 55. However, when the load resistance of the injector 70 is small or the current supplied from the internal constant current source 40 is weak, the value of the differential voltage obtained by the differential voltage measuring device 51 is very small, and there is a possibility that the determination cannot be normally performed depending on the resolution of the voltage comparison result calculation circuit 55. Therefore, as illustrated in FIG. 3, a configuration in which a voltage amplifier circuit 52 for amplifying the differential voltage obtained by the differential voltage measuring device 51 is arranged between the differential voltage measuring device 51 and the voltage comparison result calculation circuit 55 is also conceivable.

As described above, the load drive device (load drive device 100) according to the first embodiment includes the drive switch (valve opening driver 62, holding driver 61) that turns on or off the current supplied from the power source (for example, the battery having the reference voltage VB) to the load (injector 70), the switch drive circuit (pre-driver circuit 20) that transmits the drive signal to the drive switch based on the control command (signal 101) from the arithmetic device (arithmetic device 10), and the constant current source (internal constant current source 40) that supplies the current to the load without passing through the drive switch. The switch drive circuit is configured to perform control not to turn on the drive switch when the voltage between both ends of the load becomes equal to or less than the determination value (voltage threshold Vth) in a state where the drive switch is turned off (a period other than the monitoring prohibition period T) and in a state where the current (waveform 105) is supplied from the constant current source to the load.

According to the load drive device having the above-described configuration according to the first embodiment, the short-circuit failure is diagnosed before the load drive control is performed at the time of the load short-circuit, and the operation of the load drive device is prohibited. Therefore, it is possible to prevent a large current from flowing when energization is performed by normal load drive control.

That is, in the load drive device 100 described above, the constant current by the internal constant current source 40 of the pre-driver circuit 20 is supplied to the injector 70 during the OFF control of the valve opening driver 62 or the holding driver 61. Then, the voltage monitoring circuit 50 of the pre-driver circuit 20 monitors the voltage between both ends of the injector 70, and compares the monitored voltage with the determination value in the determination value table 56 to determine the short-circuit failure of the injector 70. Here, when there is a short-circuit failure in the injector 70, the pre-driver circuit 20 prohibits ON control of the valve opening driver 62 and the holding driver 61, so that it is possible to prevent a large current from flowing to the circuit by ON control of the valve opening driver 62 or the holding driver 61 in a state where the injector 70 has low resistance due to the short-circuit failure or the like.

Therefore, when the injector 70 has a short-circuit failure, the valve opening driver 62 and the holding driver 61 perform ON control, so that it is possible to prevent abnormal heat generation of the circuit due to a large current flowing, and eventually to prevent a failure of the circuit.

In addition, since it is possible to prevent a large current flowing until the operation of the load drive device is prohibited by performing diagnosis after the operation of the load drive device as in the related art, it is possible to reduce the absolute maximum rating of the driver used for control as compared with the related art. Therefore, it is possible to select a smaller and less expensive component as the driver.

Further, the controller 30 and the voltage monitoring circuit 50 of the pre-driver circuit 20 are configured by hardware, and the controller 30 performs the load stop control in a case where the driving of the load is stopped, so that the load can be stopped more quickly than the case where the arithmetic device 10 receives the comparison result of the monitored voltage and performs the load stop control.

In the present embodiment described above, the drive switch includes the first drive switch (holding driver 61) that turns on or off the current (waveform 105) supplied from the power source to the load (coil of the injector 70) and the second drive switch (valve opening driver 62) that turns on or off the current (waveform 105) supplied from the booster circuit (booster circuit 63) that boosts the voltage of the power source to the load. Then, the switch drive circuit (pre-driver circuit 20) is configured to perform control not to turn on the first drive switch and the second drive switch when the voltage between both ends of the load becomes equal to or lower than the determination value (voltage threshold Vth) in a state where the first drive switch and the second drive switch are turned off and in a state where the current (waveform 105) is supplied from the constant current source to the load.

According to the present embodiment having the above-described configuration, even in a case where the load drive device includes the first drive switch and the second drive switch used to turn on/off different currents, it is possible to obtain the same operational effects as those of the above-described configuration. That is, since the short-circuit failure is diagnosed and the operation of the load drive device is prohibited before the load drive control is performed at the time of the load short-circuit, it is possible to prevent a large current flowing when performing the energization by the normal load drive control.

In the present embodiment described above, the switch drive circuit (pre-driver circuit 20) is configured to generate a command (signal 104) for controlling energization and non-energization of the constant current source (internal constant current source 40) based on a drive signal for the drive switch (valve opening driver 62, holding driver 61).

According to the above configuration, energization and non-energization from the constant current source to the load are controlled in a period in which the drive signal (signals 102 and 103) for the drive switch (valve opening driver 62, holding driver 61) is turned off. Therefore, it is possible to prevent a large current flowing when energization is performed by normal load drive control.

In the present embodiment described above, the constant current source (internal constant current source 40) is configured to supply a current (waveform 105) smaller than a current (current threshold Ith) flowing to the load when the load (injector 70) is driven, to the load when the load is not driven.

According to the above configuration, in the failure diagnosis, the current (waveform 105) smaller than the current (current threshold Ith) flowing to the load when the load (injector 70) is driven is supplied to the load when the load is not driven. Therefore, it is possible to prevent the load from being driven although the load is originally not driven at the time of failure diagnosis.

In the present embodiment described above, the switch drive circuit (pre-driver circuit 20) includes the controller (controller 30) that generates the drive signal of the drive switch (valve opening driver 62, holding driver 61) based on the control command (signal 101), the constant current source (internal constant current source 40), and the voltage monitoring circuit (voltage monitoring circuit 50) that monitors the voltage between both ends of the load (injector 70) and determines whether the voltage between both ends of the load is equal to or less than the determination value (voltage threshold Vth). When the voltage monitoring circuit determines that the voltage between both ends of the load is equal to or lower than the determination value (voltage threshold Vth) in a state where the drive switch is turned off and the current (waveform 105) is supplied from the constant current source to the load, the controller stops the load without transmitting the drive signal for the ON state to the load.

In the present embodiment described above, the switch drive circuit (pre-driver circuit 20) is configured to be able to control energization and non-energization of the constant current source (internal constant current source 40) at an arbitrary timing in a period (period other than the monitoring prohibition period T) in which the drive switch (valve opening driver 62, holding driver 61) is turned off.

For example, in the load drive device 100 illustrated in FIG. 1, diagnosis cannot always be performed immediately after the internal constant current source 40 is turned on due to the influence of the inductance component and the capacitance component in the injector circuit 90. Therefore, it is desirable that the energization and the non-energization of the constant current source (internal constant current source 40) can be controlled at an arbitrary timing in a period (signals 102 and 103 of FIG. 2) in which the control command (valve opening driver 62, holding driver 61) is turned off.

Second Embodiment

The load drive device of a second embodiment is different from the load drive device of the first embodiment in that the determination value table 56 has a plurality of determination values and that a determination counter 57 is provided.

Figure 4:
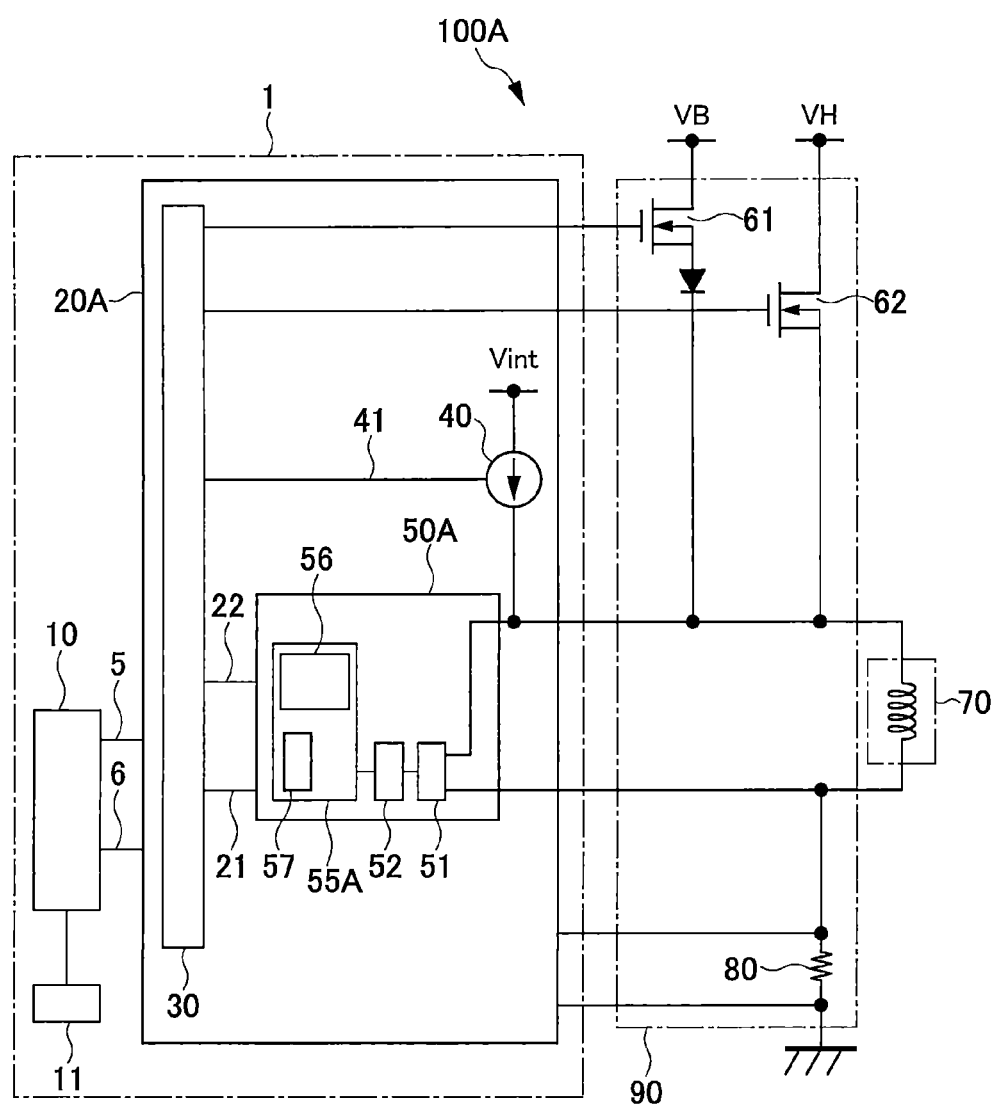
FIG. 4 is a circuit diagram illustrating a configuration example of a load drive device according to a second embodiment of the present invention.

FIG. 4 is a circuit diagram illustrating a configuration example of a load drive device 100A according to the second embodiment. The load drive device 100A has a configuration in which a determination counter 57, a comparison result transmission line 22, and a pre-driver diagnosis information transmission line 6 are added to the load drive device 100 illustrated in FIG. 1. That is, the pre-driver circuit 20A in the electronic control device 1 includes the controller 30, the internal constant current source 40, and a voltage monitoring circuit 50A. In FIG. 4, description of the booster circuit 63 illustrated in FIG. 1 is omitted.

The voltage monitoring circuit 50A includes the differential voltage measuring device 51, the voltage amplifier circuit 52, and a voltage comparison result calculation circuit 55A. The voltage amplifier circuit 52 may be omitted depending on the magnitude of the input voltage. The voltage comparison result calculation circuit 55A includes the determination value table 56 and the determination counter 57.

The determination value table 56 enables setting of a plurality of different determination values (In FIG. 5, determination values 1, n, and n+1) in accordance with an abnormal state. In addition, the user can operate the operation unit 152 to arbitrarily select a determination value (designated determination value) for prohibiting the ON control of the valve opening driver 62 and the holding driver 61 from among a plurality of determination values that can be set in the determination value table 56. The arithmetic device 10 displays selectable determination values on the display unit 151 of the operation display device 150, and the user selects an appropriate determination value (designated determination value) in accordance with the abnormal state from among the plurality of determination values. In the determination value table 56, a defined number of times for determining the number of times the voltage between both ends of the injector 70 belongs to a predetermined range is registered.

The voltage comparison result calculation circuit 55A determines in which range the value of the voltage (differential voltage) between both ends of the injector 70 (load) obtained from the differential voltage measuring device 51 is included among the ranges divided by the plurality of determination values set in the determination value table 56. Then, the determination result of the voltage comparison result calculation circuit 55A can be transmitted to the arithmetic device 10 using the pre-driver diagnosis information transmission line 6.

As described above, in the first embodiment, when the voltage comparison result calculation circuit 55A determines an abnormal state even once, the voltage comparison result calculation circuit 55A prohibits the load drive of the controller 30 of the pre-driver circuit 20A. However, in one abnormality determination, even when it is erroneously determined as an abnormal state only once due to unintended external noise or the like although there is no failure originally, the operation of the injector circuit 90 is stopped.

In addition, the operation of the injector circuit 90 is stopped even in a case where it is not desired to stop the operation of the injector circuit 90, such as a case where the resistance value of the injector 70 is lowered due to deterioration of the injector 70 or the like, or a case where the resistance value of the injector 70 is lowered due to a minor failure of the injector 70 (to an extent that a large current flows to the injector circuit 90 and a circuit failure due to abnormal heat generation does not occur).

Figure 6:
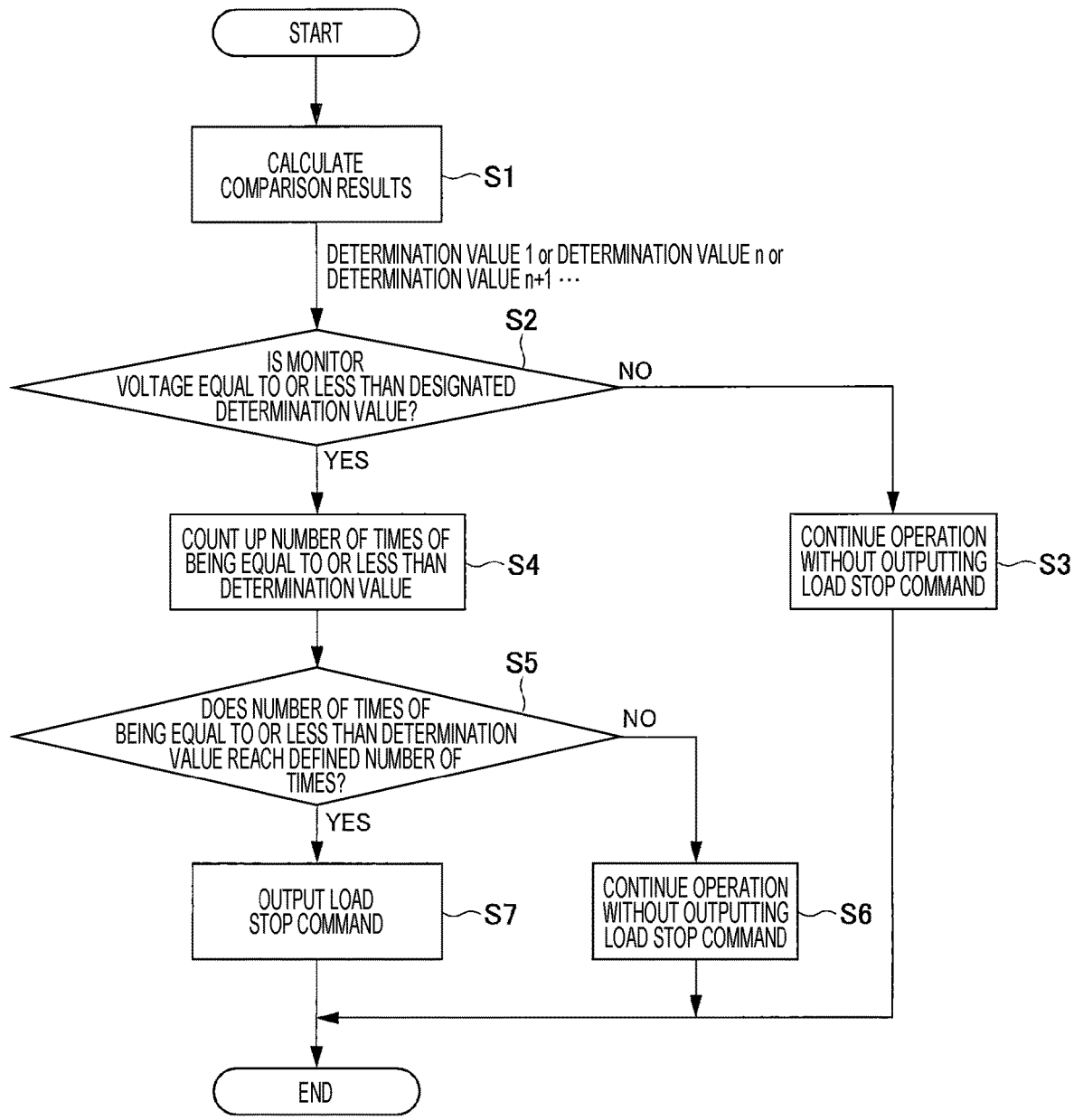
FIG. 6 is a flowchart illustrating a procedure example of diagnosis and control of the load drive device according to the second embodiment of the present invention.

Therefore, in the second embodiment, it is possible to count the number of times of the abnormal state by providing the determination counter 57 in the voltage monitoring circuit 50A. As illustrated in the flowchart of FIG. 6, the load stop command is output to the controller 30 only when the number of times of comparison between the monitor voltage and the determination value and determination of an abnormal state reaches a defined number of times.

In the present embodiment, the defined number of times is assumed to be a predetermined value, but a configuration in which the defined number of times is set to an arbitrary number of times is assumed. Note that, as a method of counting by the determination counter 57, a method of starting counting when an abnormal state continues twice or a plurality of times, and the like are conceivable, other than a method of counting as one time every time it is determined that the state is an abnormal state.

A configuration is also conceivable in which, after the abnormal state is counted a plurality of times, the count value is reset when the abnormal state is not counted for a certain period of time.

Figure 5:
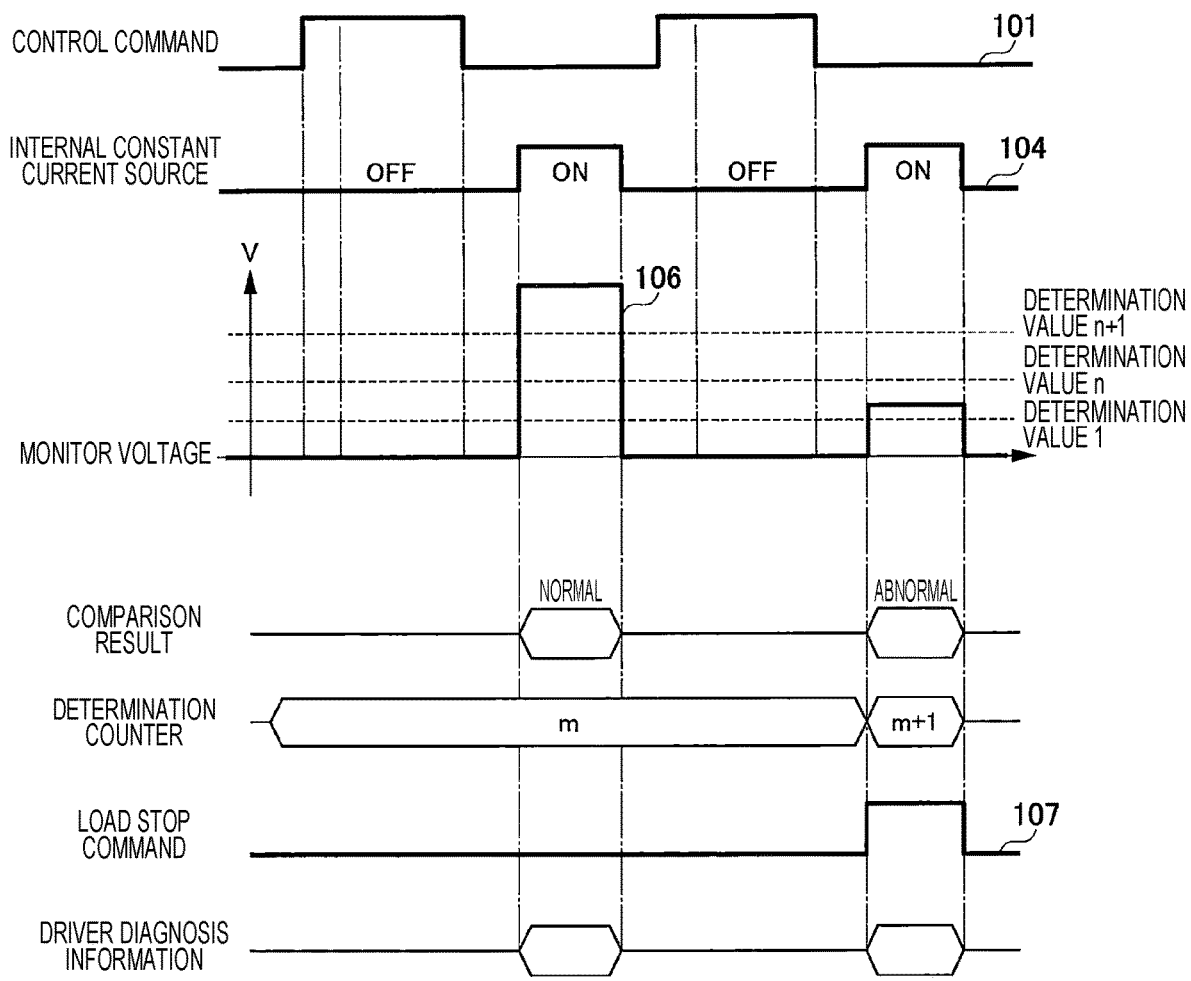
FIG. 5 is a timing chart illustrating an operation and a signal of each unit of the load drive device according to the second embodiment of the present invention.

FIG. 5 is a timing chart illustrating an operation and a signal of each unit of the load drive device 100A.

In the load drive device 100A, a control command signal (signal 101) is input from the arithmetic device 10 to the pre-driver circuit 20. The pre-driver circuit 20A that has received the control command signal performs ON control (signals 102 and 103 in FIG. 2) on the valve opening driver 62 and the holding driver 61 from the controller 30 to energize the injector 70 (load).

Here, when the internal constant current source 40 is brought into the energized state (signal 104) by the controller 30, the voltage monitoring circuit 50A monitors the voltage applied to both ends of the injector 70 by the differential voltage measuring device 51. The monitored voltage (waveform 106) obtained by the differential voltage measuring device 51 is output to the voltage comparison result calculation circuit 55 and compared with the plurality of determination values 1, n, and n+1 stored in the determination value table 56. As an example, it is assumed that the monitor voltage is abnormal when the monitor voltage is equal to or less than the determination value n.

In FIG. 5, since the value of the monitored voltage when the internal constant current source 40 is turned on for the first time is larger than the determination value n+1, the voltage comparison result calculation circuit 55A outputs the comparison result "normal" to the determination counter 57. Since the value of the monitored voltage when the internal constant current source 40 is turned on for the second time is within the range between the determination value 1 and the determination value n and is equal to or less than the determination value n, the voltage comparison result calculation circuit 55A outputs the comparison result "abnormal" to the determination counter 57.

The determination counter 57 counts the number of times that the voltage comparison result calculation circuit 55A determines that the monitored voltage belongs to a predetermined range (for example, abnormal state) among ranges divided by a plurality of determination values. Therefore, as illustrated in FIG. 5, the determination counter 57 does not count when receiving the first comparison result "normal" (count value "m"), and counts up the count value from "m" to "m+1" when receiving the second comparison result "abnormal".

Then, the voltage monitoring circuit 50A transmits the determination result of the voltage comparison result calculation circuit 55A to the arithmetic device 10 using the pre-driver diagnosis information transmission line 6 each time.

FIG. 6 is a flowchart illustrating a procedure example of diagnosis and control of the load drive device 100A.

First, the voltage comparison result calculation circuit 55A of the voltage monitoring circuit 50A compares the voltage (monitored voltage) between both ends of the injector 70 with the plurality of determination values, and calculates a comparison result (S1).

Next, the voltage comparison result calculation circuit 55A determines, from the comparison result, whether the monitored voltage is equal to or less than the designated determination value (S2). The designated determination value is a determination value that prohibits the ON control of the valve opening driver 62 and the holding driver 61 among the plurality of determination values, and corresponds to the determination value n in the above-described example. Here, when the monitored voltage is not equal to or less than the designated determination value (NO in S2), the voltage comparison result calculation circuit 55A continues the load drive control without issuing a load stop command to the controller 30 (S3).

On the other hand, when the monitor voltage is equal to or less than the designated determination value (YES in S2), the voltage comparison result calculation circuit 55A counts up the number of times the monitor voltage counted by the determination counter 57 becomes equal to or less than the determination value (S4).

Next, the voltage comparison result calculation circuit 55A determines whether the number of times the monitored voltage has become equal to or less than the determination value has reached the defined number of times (S5). If the number of times the monitored voltage has become equal to or less than the determination value has not reached the defined number of times (NO in S5), the voltage comparison result calculation circuit 55A continues the load drive control without issuing a load stop command to the controller 30 (S6).

In parallel with the processing of Steps S3 and S6, the determination result (range to which monitored voltage belongs, count value of the determination counter 57) of the voltage comparison result calculation circuit 55A may be notified to the arithmetic device 10 using the pre-driver diagnosis information transmission line 6. The arithmetic device 10 outputs the determination result to the display unit 151.

On the other hand, when the number of times the monitored voltage has become equal to or less than the determination value has reached the defined number of times (YES in S5), the voltage comparison result calculation circuit 55A outputs a load stop command to the controller 30 through a load stop command line 21 (S7). After the processing of Step S3, S6, or S7, the process returns to Step S1, and a series of processing is repeated.

Note that, in the example illustrated in FIGS. 4 to 6, the voltage comparison result calculation circuit 55A has a configuration in which a plurality of determination values are set in the determination value table 56 and a configuration including the determination counter 57, but may have a configuration including only one of them.

As described above, in the load drive device (load drive device 100A) according to the second embodiment, the plurality of different determination values (determination values 1, n, and n+1) are set as the determination values, and the switch drive circuit (pre-driver circuit 20A) is configured to perform control not to turn on the drive switch in a state where the drive switch (valve opening driver 62, holding driver 61) is turned off and in a state where a current is supplied from the constant current source (internal constant current source 40) to the load (injector 70), in a case where a voltage between both ends of the load belongs to a predetermined range (for example, a designated determination value or less) among ranges divided by the plurality of determination values.

According to the load drive device having the above-described configuration according to the second embodiment, as in the first embodiment, the short-circuit failure is diagnosed before the load drive control is performed at the time of the load short-circuit, and the operation of the load drive device is prohibited. Therefore, it is possible to prevent a large current from flowing when energization is performed by normal load drive control. Further, according to the present embodiment, a plurality of determination values that can be arbitrarily set in accordance with an abnormal state are provided, and it is determined whether a voltage between both ends of the load belongs to a predetermined range (abnormal state) among ranges divided by the plurality of determination values. Thus, for example, when a large current flows to the load (injector circuit 90) and the resistance value of the load decreases to such an extent that a circuit failure due to abnormal heat generation does not occur, it is possible to avoid sudden stop of driving of the load (an engine or the like of an automobile).

In addition, in the load drive device (load drive device 100A) according to the second embodiment, the plurality of different determination values (determination values 1, n, and n+1) are set as the determination values, and the switch drive circuit (pre-driver circuit 20A) is configured not to turn on the drive switch in a state where the drive switch (valve opening driver 62, holding driver 61) is turned off and in a state where a current is supplied from the constant current source (internal constant current source 40) to the load (injector 70), in a case where a voltage between both ends of the load belongs to a predetermined range (for example, a designated determination value or less) among ranges divided by the plurality of determination values and in a case where the number of times the voltage between both ends of the load belongs to the predetermined range reaches a predetermined defined number of times.

According to the load drive device having the above-described configuration according to the second embodiment, as in the first embodiment, the short-circuit failure is diagnosed before the load drive control is performed at the time of the load short-circuit, and the operation of the load drive device is prohibited. Therefore, it is possible to prevent a large current from flowing when energization is performed by normal load drive control. Further, according to the present embodiment, similarly to the configuration described above, by including a plurality of determination values and determining whether a voltage between both ends of the load belongs to a predetermined range (abnormal state) among ranges divided by the plurality of determination values, it is possible to avoid sudden stop of driving of the load (an engine or the like of an automobile) when the resistance value of the load decreases to such an extent that a circuit failure due to abnormal heat generation does not occur.

Furthermore, according to the present embodiment, determination of abnormality is performed by counting the number of times the voltage between both ends of the load belongs to a predetermined range, thereby preventing erroneous determination of an abnormal state due to external noise or the like with a small number of times such as once. Therefore, it is possible to prevent an emergency stop of the load (an engine or the like of an automobile) due to erroneous detection of an abnormal state due to unexpected external noise or the like.

In addition, the load drive device (load drive device 100A) according to the second embodiment includes the drive switch (valve opening driver 62, holding driver 61) that turns on or off the current supplied from the power source (for example, the battery having the reference voltage VB) to the load (coil of the injector 70), the switch drive circuit (pre-driver circuit 20) that transmits the drive signal to the drive switch based on the control command (signal 101) from the arithmetic device (arithmetic device 10), and the constant current source (internal constant current source 40) that supplies the current to the load without passing through the drive switch, and the plurality of different determination values (determination values 1, n, and n+1) are set as the determination values. Then, the switch drive circuit (pre-driver circuit 20A) determines whether the voltage between both ends of the load is included in a predetermined range (for example, a designated determination value or less) among the ranges divided by the plurality of determination values in a state where the drive switch (valve opening driver 62, holding driver 61) is turned off and in a state where the current is supplied from the constant current source (internal constant current source 40) to the load (injector 70), and notifies the determination result to the arithmetic device (arithmetic device 10), and the arithmetic device is configured to perform control according to the determination result.

In the present embodiment described above, the arithmetic device (arithmetic device 10) is configured to perform control of outputting a control command for turning on the drive switch (valve opening driver 62, holding driver 61) to the switch drive circuit (pre-driver circuit 20A) or control of outputting a warning according to the determination result.

According to the load drive device having the above-described configuration according to the present embodiment, as in the first embodiment, the short-circuit failure is diagnosed before the load drive control is performed at the time of the load short-circuit, and the operation of the load drive device is prohibited. Therefore, it is possible to prevent a large current from flowing when energization is performed by normal load drive control.

Further, according to the present embodiment, similarly to the configuration described above, a plurality of determination values are provided, and it is determined whether the voltage between both ends of the load is included in a predetermined range (abnormal state) among ranges divided by the plurality of determination values, and the determination result is notified to the arithmetic device. As a result, it is possible to continue driving the load without determining the failure depending on the degree of the determination result, or to notify the driver of the failure state by the display unit 151 (a warning lamp or the like in the automobile) as necessary, give the driver a time to move the automobile to a safe place, and encourage a repair shop such as a dealer to repair the automobile.

For example, the setting may be such that the load is stopped when the voltage between both ends of the load is equal to or less than the determination value 1, a warning (load operation continuation) is given when the voltage between both ends of the load is in a range between the determination value 1 and the determination value n, a warning (load operation continuation) is given when the voltage between both ends of the load is in a range between the determination value n and the determination value n+1, and the determination that the voltage between both ends of the load is normal when the voltage between both ends of the load is larger than the determination value n+1. The arithmetic device 10 performs load drive control, caution/warning output, or the like on the basis of the setting of these determination values.

In the first embodiment, the load drive device 100 (FIG. 1) may include the pre-driver diagnosis information transmission line 6, and the pre-driver circuit 20 (switch drive circuit) may be configured to notify the arithmetic device 10 that the voltage between both ends of the injector 70 is equal to or less than the determination value. That is, in FIG. 1, the monitoring result (short-circuit abnormality of the load) of the voltage monitoring circuit 50 is transmitted from the pre-driver circuit 20 to the arithmetic device 10 via the pre-driver diagnosis information transmission line 6, and is output to the display unit 151. As a result, for example, the driver of the automobile can grasp that the cause of the engine stop is the short-circuit abnormality of the load.

Third Embodiment

A third embodiment has a configuration in which a drive switch is provided on the downstream side of the injector 70 with respect to the load drive device 100 according to the first embodiment.

Figure 7:
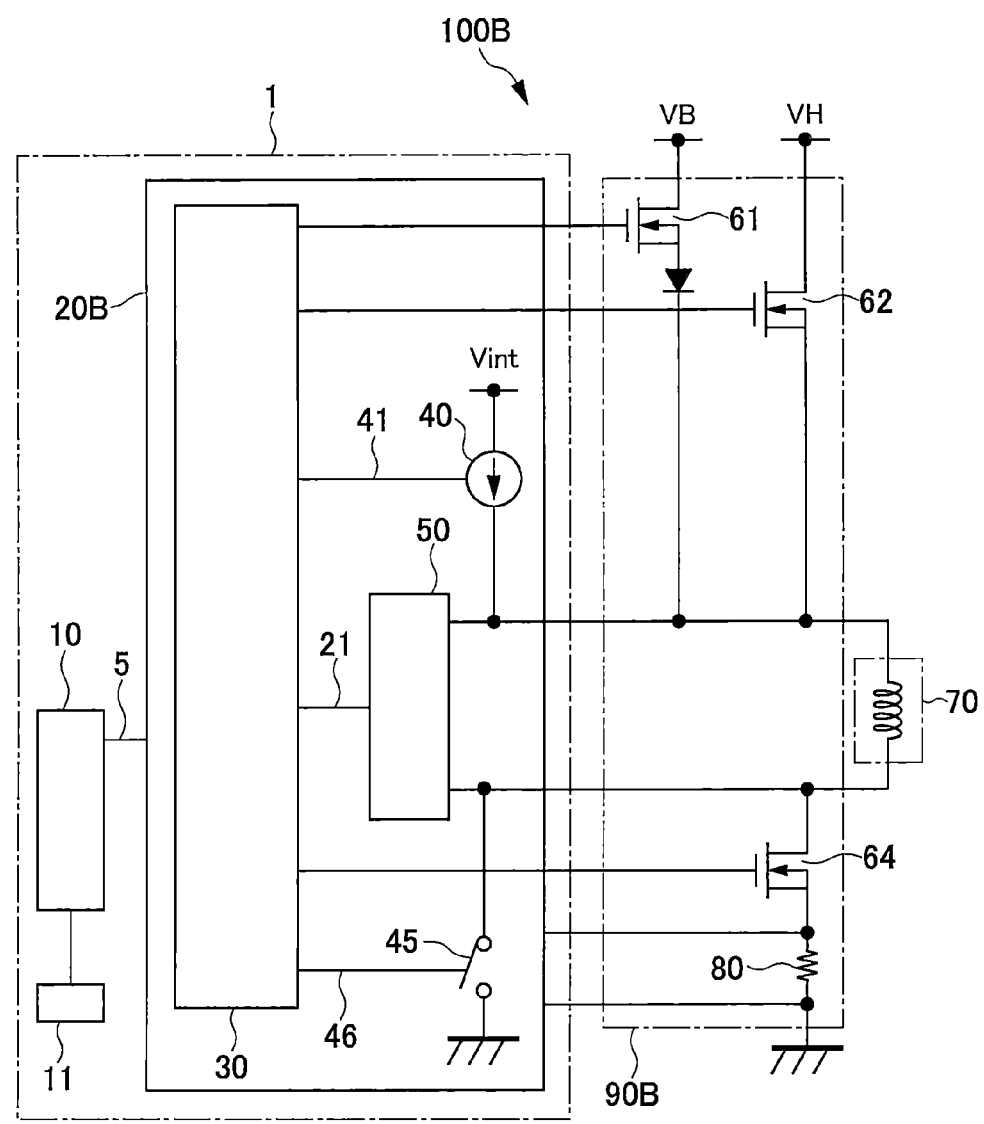
FIG. 7 is a circuit diagram illustrating a configuration example of a load drive device according to a third embodiment of the present invention.

FIG. 7 is a circuit diagram illustrating a configuration example of a load drive device 100B according to the third embodiment.

In the injector circuit 90 (FIG. 1) according to the first embodiment, since there is no path for cutting off the current on the downstream side of the injector 70, it is possible to supply a constant current to the injector 70 by turning on the internal constant current source 40. However, an injector circuit 90B in the third embodiment includes a drive switch (energization/non-energization switching driver 64) disposed on a downstream side of the load in the direction in which the current supplied from the power source (for example, the battery of the reference voltage VB) to the load (injector 70) flows. In FIG. 7, the energization/non-energization switching driver 64 is connected between the coil of the injector 70 and the injector current monitoring resistor 80 on the downstream side thereof. As a result, energization/non-energization of the load can be switched on the downstream side of the load.

In the failure diagnosis, since the control of the valve opening driver 62, the holding driver 61, and the energization/non-energization switching driver 64 is all performed at the timing of the OFF control, the constant current supplied from the internal constant current source 40 is cut off by the energization/non-energization switching driver 64. Therefore, in the load drive device 100B according to the present embodiment, an internal switch 45 and an internal switch control line 46 are added to the downstream side of the injector 70, the internal constant current source 40 is turned on, and at the same time, the internal switch 45 is turned on via the internal switch control line 46, as compared with the first embodiment. A switch element such as a MOSFET is used for the energization/non-energization switching driver 64 and the internal switch 45.

As described above, a pre-driver circuit 20B includes the diagnostic switch (internal switch 45) that is disposed on a downstream side of the load (injector 70) and supplies the current from the constant current source (internal constant current source 40) to the load by being turned on in a state where the downstream drive switch (energization/non-energization switching driver 64) is turned off. As a result, even when the drive switch (energization/non-energization switching driver 64) on the downstream side is in the OFF control, the current of the constant current source can be energized to the load.

Figure 8:
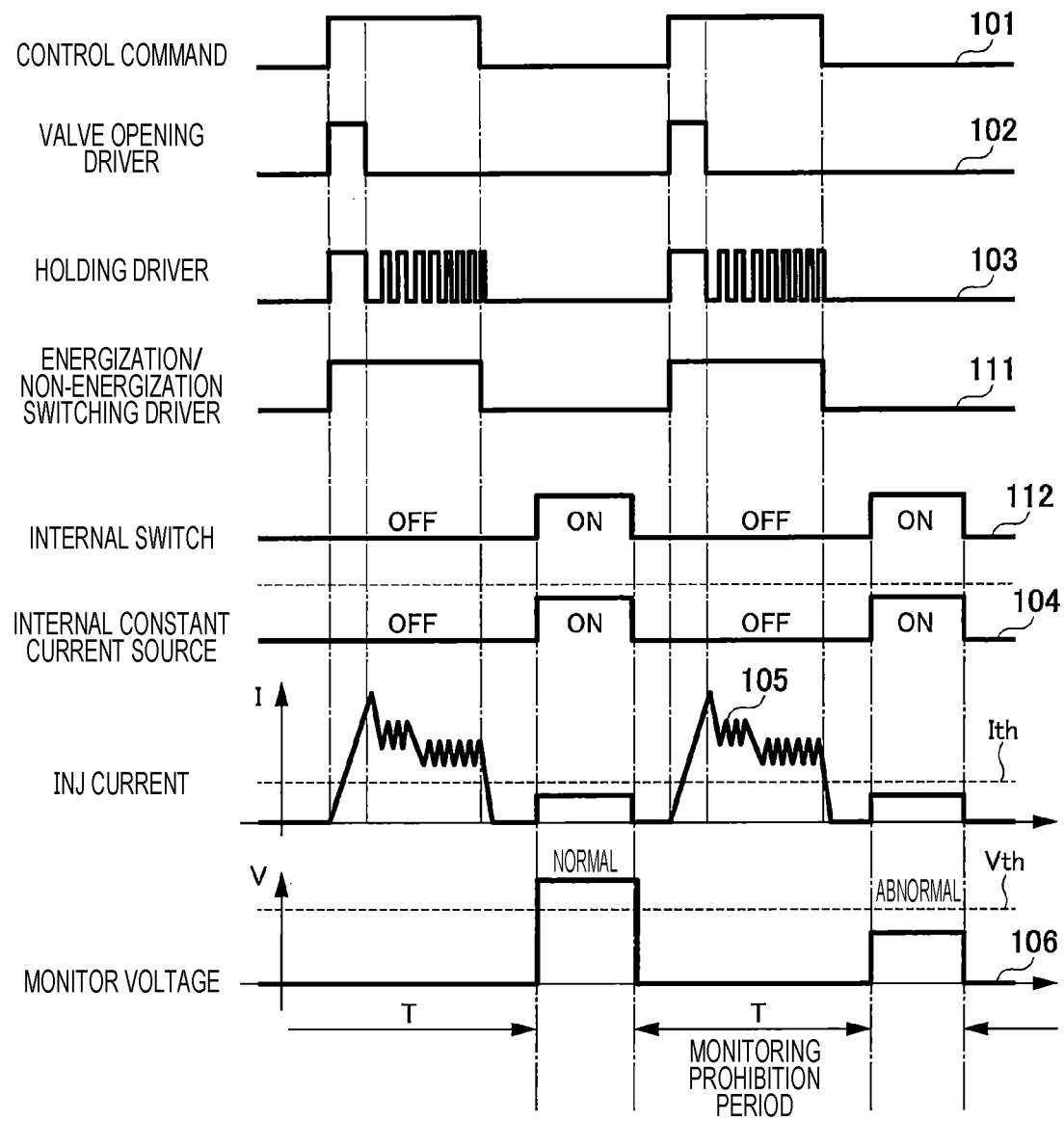
FIG. 8 is a timing chart illustrating an operation and a signal of each unit of the load drive device according to the third embodiment of the present invention.

FIG. 8 is a timing chart illustrating an operation and a signal of each unit of the load drive device according to the third embodiment. In FIG. 8, the drive signal (signal 111) of the energization/non-energization switching driver 64 and the command signal (signal 112) of the internal switch 45 are added to the timing chart of FIG. 2, and the load stop command (signal 107) is omitted.

As illustrated in FIG. 8, during the ON control of the control command output from the arithmetic device 10, the drive signal supplied from the controller 30 to the energization/non-energization switching driver 64 is also in the ON control state (signal 111). The internal switch 45 is turned on by the controller 30 via the internal switch control line 46 at the same time as the internal constant current source 40 is turned on (signal 112). The others are the same as those in the timing chart of FIG. 2.

As described above, the load drive device (load drive device 200B) according to the third embodiment includes, as the drive switch, the upstream drive switch (valve opening driver 62, holding driver 61) disposed on the upstream side with respect to the load and the downstream drive switch (energization/non-energization switching driver 64) disposed on a downstream side of the load in the direction in which the current supplied from the power source to the load (injector 70) flows, and further includes the diagnostic switch (internal switch 45) that supplies the current from the constant current source (internal constant current source 40) to the load by being turned on in a state where the upstream drive switch and the downstream drive switch are turned off.

In addition, in the present embodiment, the switch drive circuit (pre-driver circuit 20B) performs control so as not to turn on any one of the upstream drive switch and the downstream drive switch, or either the upstream drive switch or the downstream drive switch when the voltage between both ends of the load becomes equal to or less than the determination value in a state where the upstream drive switch (valve opening driver 62, holding driver 61) and the downstream drive switch (energization/non-energization switching driver 64) are turned off and in a state where the diagnostic switch (internal switch 45) is turned on to supply the current from the constant current source (internal constant current source 40) to the load (injector 70).

The load drive device according to the present embodiment having the above configuration can supply the current from the constant current source to the load without passing through the upstream drive switch and the downstream drive switch by including the diagnostic switch even in the configuration including the downstream drive switch disposed on a downstream side of the load. Therefore, in the present embodiment, the same operational effects as those of the first and second embodiments can be obtained. That is, since the short-circuit failure is diagnosed and the operation of the load drive device is prohibited before the load drive control is performed at the time of the load short-circuit, it is possible to prevent a large current flowing when performing the energization by the normal load drive control.

In FIG. 7, the internal constant current source 40 is disposed on the upstream side of the injector 70, and the internal switch 45 is disposed on the downstream side of the injector 70. However, the internal switch 45 may be disposed on the upstream side of the injector 70, and the internal constant current source 40 may be disposed on the downstream side of the injector 70.

In addition, instead of disposing the internal switch 45 on the downstream side of the injector 70, a configuration is also conceivable in which only the energization/non-energization switching driver 64 is in the ON control while the valve opening driver 62 and the holding driver 61 are in the OFF control to energize the injector 70 with the current of the internal constant current source 40.

Fourth Embodiment

A fourth embodiment is a configuration in which a plurality of injectors are provided as a load instead of the injector 70 in the load drive device 100B according to the third embodiment.

Figure 9:
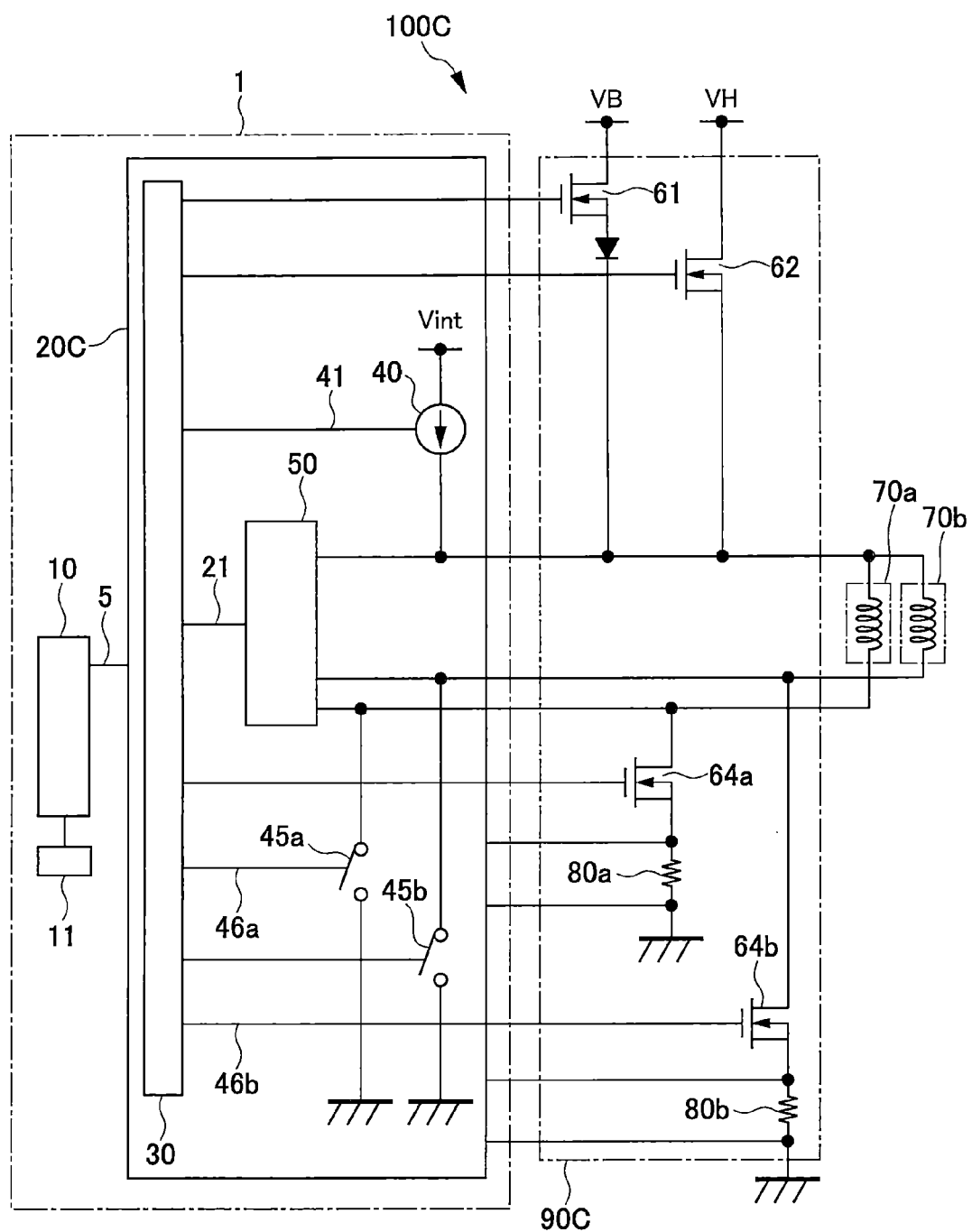
FIG. 9 is a circuit diagram illustrating a configuration example of a load drive device according to a fourth embodiment of the present invention.

FIG. 9 is a circuit diagram illustrating a configuration example of a load drive device 100C according to the fourth embodiment.

In an injector circuit 90C of the load drive device 100C, the injector 70 in FIG. 7 is replaced with an injector 70a and an injector 70b. Therefore, the injector circuit 90C has a configuration in which energization/non-energization switching drivers 64a and 64b and injector current monitoring resistors 80a and 80b are prepared for the injectors 70a and 70b, respectively. In addition, a pre-driver circuit 20C is provided with internal switches 45a and 45b and internal switch control lines 46a and 46b corresponding to the configuration of the injector circuit 90C.

In the present embodiment, the load connected to the downstream side of the valve opening driver 62 and the holding driver 61 is two of the injector 70a and the injector 70b, but a configuration in which more than two (n+1) loads are connected is also conceivable. In this case, the internal switch 45, the internal switch control line 46, the injector current monitoring resistor 80, and the energization/non-energization switching driver 64 are similarly configured by (n+1) switches.

Further, in the present embodiment, the internal switch control lines 46 are individually configured every time the internal switches 45 increase to 1, 2, . . . , n+1, but the present invention is not limited to this example. For example, a configuration is also conceivable in which a plurality of internal switches 45 are simultaneously controlled by one internal switch control line with respect to the plurality of internal switches 45.

As described above, in the load drive device (load drive device 200C) according to the fourth embodiment, the load is configured by a first load (injector 70a) on the downstream side of the drive switch (valve opening driver 62, holding driver 61) and a second load (injector 70b) disposed in parallel with the first load in the direction in which the current supplied from the power source to the load flows, and includes a first downstream drive switch (energization/non-energization switching driver 64a) disposed on a downstream side of the first load and a second downstream drive switch (energization/non-energization switching driver 64b) disposed on a downstream side of the second load.

In addition, in the present embodiment, the switch drive circuit (pre-driver circuit 20C) performs control so as not to turn on any one of the first downstream drive switch and the second downstream drive switch when the voltage between both ends of the first load or the second load becomes equal to or less than the determination value in a state where the drive switch (valve opening driver 62, holding driver 61), the first downstream drive switch (energization/non-energization switching driver 64a), and the second downstream drive switch (energization/non-energization switching driver 64b) are turned off and in a state where the current is supplied from the constant current source (internal constant current source 40) to the first load (injector 70a) or the second load (injector 70b).

Even in a configuration in which the load drive device according to the present embodiment having the above configuration includes a plurality of downstream drive switches disposed on a downstream side of each load corresponding to a plurality of (for example, two) loads, it is possible to supply a current from the constant current source to the load without passing through each drive switch by controlling on/off of the upstream drive switch (valve opening driver 62, holding driver 61) and the plurality of downstream drive switches. Therefore, in the present embodiment, the same operational effects as those of the first to third embodiments can be obtained. That is, before the load drive control is performed at the time of short-circuit of any load among the plurality of loads, the short-circuit failure is diagnosed to prohibit the operation of the load drive device, so that it is possible to prevent a large current flowing at the time of energization by normal load drive control.

In addition, the present embodiment includes: a first downstream side diagnostic switch (internal switch 45a) that is disposed on a downstream side of the first load (injector 70a) and supplies a current from the constant current source (internal constant current source 40) to the first load by being turned on in a state where the first downstream drive switch (energization/non-energization switching driver 64a) is turned off; and a second downstream side diagnostic switch (internal switch 45b) that is disposed on a downstream side of the second load (injector 70b) and supplies a current from the constant current source (internal constant current source 40) to the second load by being turned on in a state where the second downstream drive switch is turned off (energization/non-energization switching driver 64b), in a direction in which a current supplied from the power source to the load flows.

Even in a configuration in which the load drive device according to the present embodiment having the above configuration includes a plurality of downstream drive switches disposed on a downstream side of each load corresponding to a plurality of (for example, two) loads, it is possible to supply a current from the constant current source to the load without passing through the upstream drive switch (valve opening driver 62, holding driver 61) and the plurality of downstream drive switches by including the first diagnostic switch and the second diagnostic switch. Therefore, in the present embodiment, the same operational effects as those of the first to third embodiments can be obtained. That is, before the load drive control is performed at the time of short-circuit of any load among the plurality of loads, the short-circuit failure is diagnosed to prohibit the operation of the load drive device, so that it is possible to prevent a large current flowing at the time of energization by normal load drive control.

The load drive device 100C according to the present embodiment illustrated in FIG. 9 includes the injector circuit 90C in which the driver disposed on an upstream side of the load is only one set, that is, only the valve opening driver 62 and the holding driver 61, and the load is configured by the plurality of loads (injectors 70a and 70b). The load drive device 100C includes the energization/non-energization switching drivers 64a and 64b, the injector current monitoring resistors 80a and 80b, and the internal switches 45a and 45b for each of the plurality of injectors 70a and 70b. As a result, the constant current of the internal constant current source 40 can be individually supplied to each of the injectors 70a and 70b, and failure diagnosis can be individually performed for each of the injectors 70a and 70b.

Others

Further, the present invention is not limited to each of the above-described embodiments, and it goes without saying that various other application examples and modifications can be taken without departing from the gist of the present invention described in the claims.

For example, the above-described embodiments describe the configuration of the load drive device in detail and specifically in order to help understanding of the present invention, and are not necessarily limited to those including all the described components. In addition, a part of the configuration of one embodiment can be replaced with a component of another embodiment. In addition, components of other embodiments can be added to the configuration of one embodiment. In addition, it is also possible to add, replace, or delete other components for a part of the configuration of each embodiment.

In addition, some or all of the configurations, functions, and processing units may be realized in hardware such as an integrated circuit. A field programmable gate array (FPGA), an application specific integrated circuit (ASIC), or the like may be used as the hardware. In addition, each of the above-described components, functions, and the like may be realized by software using a processor (for example, a CPU used in the arithmetic device 10) which is included in a computer and interprets and executes a program for realizing each function. Information such as a program, a table, and a file for realizing each function can be stored in a recording device such as a semiconductor memory (for example, the memory 11), a hard disk, and a solid state drive (SSD), or a recording medium such as an IC card, an SD card, and an optical disk.

Further, in the above embodiments, only control lines and information lines considered to be necessary for explanation are illustrated, but not all the control lines and the information lines for a product are illustrated. In practice, almost all the components may be considered to be connected to each other.

REFERENCE SIGNS LIST

1 electronic control device (ECU)
5 pre-driver control command line
6 pre-driver diagnostic information transmission line
10 arithmetic device
11 memory
20, 20A pre-driver circuit
21 load stop command line
22 comparison result transmission line
30 controller
40 internal constant current source
41 internal constant current source control line
45 internal switch
46 internal switch control line
50, 50A voltage monitoring circuit
51 differential voltage measuring device
52 voltage amplifier circuit
55, 55A voltage comparison result calculation circuit
56 determination value table
57 determination counter
61 holding driver
62 valve opening driver
63 booster circuit
64 energization/non-energization switching driver
70, 70*a*, 70*b* injector
80, 80*a*, 80*b* injector current monitoring resistor (resistor)
90, 90B, 90C injector circuit
100, 100A to 100C load drive device
150 operation display device
151 display unit
152 operation unit

The invention claimed is:

1. A load drive device comprising:
a drive switch that turns on or off a current supplied from a power source to a load;
a switch drive circuit that transmits a drive signal to the drive switch based on a control command from an arithmetic device; and
a constant current source that supplies a current to the load without passing through the drive switch,
wherein the switch drive circuit includes a voltage monitoring circuit connected to monitor a voltage difference between both ends of the load and determine whether the voltage difference is equal to or less than a predefined value,
wherein the switch drive circuit performs control so as not to supply current from the constant current source to the load when the drive switch is turned on to supply current to the load, and
wherein the switch drive circuit performs further control so as not to turn on the drive switch when a voltage difference between both ends of the load becomes equal to or less than the predefined value in a state where the drive switch is turned off and where a current is supplied from the constant current source to the load.

2. The load drive device according to claim 1, wherein the drive switch includes a first drive switch that turns on or off a current supplied from the power source to the load and a second drive switch that turns on or off a current supplied from a booster circuit that boosts a voltage of the power source to the load, and
the switch drive circuit performs control so as not to turn on either the first drive switch or the second drive switch when the voltage between both ends of the load becomes equal to or less than the predefined value in a state where the first drive switch and the second drive switch are turned off and in a state where a current is supplied from the constant current source to the load.

3. The load drive device according to claim 1, wherein the switch drive circuit generates a command for controlling energization and non-energization of the constant current source based on the drive signal for the drive switch.

4. The load drive device according to claim 1, wherein the constant current source supplies a current smaller than a current flowing to the load when the load is driven to the load when the load is not driven.

5. The load drive device according to claim 1, wherein the constant current source is disposed on an upstream side of the load.

6. The load drive device according to claim 1, wherein the switch drive circuit includes a controller that generates the drive signal of the drive switch based on the control command, the constant current source, and a voltage monitoring circuit that monitors the voltage between both ends of the load to determine whether the voltage between both ends of the load is equal to or less than the predefined value, and
when the voltage monitoring circuit determines that the voltage between both ends of the load is equal to or less than the predefined value in a state where the drive switch is turned off and in a state where a current is supplied from the constant current source to the load, the controller performs control to stop the load without transmitting the drive signal in the ON state to the load.

7. The load drive device according to claim 1, wherein the drive switch is disposed on an upstream side of the load in a direction in which a current supplied from the power source to the load flows.

8. The load drive device according to claim 1, wherein the drive switch is disposed on a downstream side of the load in a direction in which a current supplied from the power source to the load flows.

9. The load drive device according to claim 8, comprising a diagnostic switch that is disposed on a downstream side of the load and supplies a current from the constant current source to the load by being turned on in a state where the downstream drive switch is turned off.

10. The load drive device according to claim 1, wherein the predefined value is included in a plurality of different predefined values stored in a recording device or a recording medium, and
when the voltage between both ends of the load is within a predetermined range among ranges defined by the plurality of predefined values in a state where the drive switch is turned off and in a state where a current is supplied from the constant current source to the load, the switch drive circuit performs control so as not to turn on the drive switch.

11. The load drive device according to claim 1, wherein
the predefined value is included in a plurality of different predefined values stored in a recording device or a recording medium, and
when the voltage between both ends of the load is within a predetermined range among ranges defined by the plurality of predefined values and when a number of times the voltage between both ends of the load is within the predetermined range reaches a predetermined defined number of times in a state where the drive switch is turned off and in a state where a current is supplied from the constant current source to the load, the switch drive circuit performs control so as not to turn on the drive switch.

12. The load drive device according to claim 1, wherein the switch drive circuit notifies the arithmetic device that the voltage between both ends of the load has become equal to or less than the at least one predefined value.

13. The load drive device according to claim 1, comprising:
as the drive switch, an upstream drive switch disposed on an upstream side of the load and a downstream drive switch disposed on a downstream side of the load in a direction in which a current supplied from the power source to the load flows; and
a diagnostic switch that supplies a current from the constant current source to the load by being turned on in a state where the upstream drive switch and the downstream drive switch are turned off.

14. The load drive device according to claim 13, wherein the switch drive circuit performs control so as not to turn on any one of the upstream drive switch and the downstream drive switch, or either the upstream drive switch or the downstream drive switch when the voltage between both ends of the load becomes equal to or less than the at least one predefined value in a state where the upstream drive switch and the downstream drive switch are turned off and in a state where the diagnostic switch is turned on and a current is supplied from the constant current source to the load.

15. The load drive device according to claim 1, wherein
the load includes a first load disposed on a downstream side of the drive switch and a second load arranged in parallel with the first load in a direction in which a current supplied from the power source to the load flows, and
the load drive device comprises a first downstream drive switch disposed on a downstream side of the first load, and a second downstream drive switch disposed on a downstream side of the second load.

16. The load drive device according to claim 15, wherein when a voltage between both ends of the first load or the second load becomes equal to or less than the at least one predefined value in a state where the drive switch, the first downstream drive switch, and the second downstream drive switch are turned off, and in a state where a current is supplied from the constant current source to the first load or the second load, the switch drive circuit performs control so as not to turn on any of the first downstream drive switch and the second downstream drive switch.

17. The load drive device according to claim 15, comprising:
a first downstream side diagnostic switch that is disposed on a downstream side of the first load in a direction in which a current supplied from the power source to the load flows, and supplies a current from the constant current source to the first load by being turned on in a state where the first downstream drive switch is turned off; and
a second downstream side diagnostic switch that is disposed on a downstream side of the second load and supplies a current from the constant current source to the second load by being turned on in a state where the second downstream drive switch is turned off.

18. The load drive device according to claim 1, wherein the switch drive circuit can control energization and non-energization of the constant current source at an arbitrary timing during a period in which the drive switch is turned off.

19. The load drive device according to claim 1, wherein the load operates to perform a load function when a sufficient amount of current is supplied to the load, and wherein the amount of current supplied by the constant current source is not sufficient to operate the load to perform the load function.

20. The load drive device according to claim 19, wherein the load comprises a coil of a fuel injector and wherein the load function comprises opening the fuel injector.

21. A load drive device comprising:
a drive switch that turns on or off a current supplied from a power source to a load;
a switch drive circuit that transmits a drive signal to the drive switch based on a control command from an arithmetic device; and
a constant current source that supplies a current to the load without passing through the drive switch,
wherein a plurality of different predefined values are stored in a recording device or a recording medium,
wherein the switch drive circuit performs control so as not to supply current from the constant current source to the load when the drive switch is turned on to supply current to the load,
wherein, in a state where the drive switch is turned off and where a current is supplied from the constant current source to the load, the switch drive circuit determines a range in which a voltage between both ends of the load is included among ranges defined by the plurality of predefined values, and notifies the arithmetic device of a determination result, and
wherein, the arithmetic device performs control according to the determination result.

22. The load drive device according to claim 21, wherein the arithmetic device performs control to output the control command for turning on the drive switch to the switch drive circuit or control to output a warning according to the determination result.

* * * * *